(12) United States Patent
Lee et al.

(10) Patent No.: US 12,434,996 B2
(45) Date of Patent: Oct. 7, 2025

(54) COVER WINDOW, METHOD OF MANUFACTURING THE COVER WINDOW, AND DISPLAY DEVICE

(71) Applicant: SAMSUNG DISPLAY CO., LTD., Yongin-si (KR)

(72) Inventors: Changmoo Lee, Yongin-si (KR); Byunghoon Kang, Yongin-si (KR); Cheolmin Park, Yongin-si (KR); Seungho Kim, Yongin-si (KR); Hoikwan Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 737 days.

(21) Appl. No.: 17/462,294

(22) Filed: Aug. 31, 2021

(65) Prior Publication Data
US 2022/0272855 A1    Aug. 25, 2022

(30) Foreign Application Priority Data
Feb. 24, 2021    (KR) .................. 10-2021-0025120

(51) Int. Cl.
*C03C 17/00*    (2006.01)
*C03B 23/023*    (2006.01)
(Continued)

(52) U.S. Cl.
CPC ............ *C03C 17/00* (2013.01); *C03B 23/023* (2013.01); *C03C 15/00* (2013.01); *C03C 19/00* (2013.01);
(Continued)

(58) Field of Classification Search
None
See application file for complete search history.

(56) References Cited

U.S. PATENT DOCUMENTS 3,174,258 A * 3/1965 Kenny ................ B24D 13/147
451/490
4,155,627 A * 5/1979 Gale .................. G02B 27/4238
359/568
(Continued)

FOREIGN PATENT DOCUMENTS

CN    202701950 U  *  1/2013  ............ C03C 15/00
CN    109896753 A  *  6/2019  ............ C03C 15/00
(Continued)

OTHER PUBLICATIONS

Wet etch (Year: 2010).*
(Continued)

*Primary Examiner* — Jodi C Franklin
(74) *Attorney, Agent, or Firm* — CANTOR COLBURN LLP

(57) ABSTRACT

A cover window includes a lower surface and an upper surface opposite to the lower surface. The upper surface includes: a center area extending in a first direction and being spaced apart from the lower surface by a first interval in a thickness direction; a first curved area extending in a curved shape from a first side of the center area; and a first area extending from the first curved area in the first direction and being spaced apart from the lower surface by a second interval in the thickness direction; and the first curved area includes a first partial area concavely extending from the center area and a second partial area convexly extending from the first partial area in a cross-sectional view.

6 Claims, 14 Drawing Sheets

(51) Int. Cl.
  *C03C 15/00* (2006.01)
  *C03C 19/00* (2006.01)
  *H05K 5/03* (2006.01)
  *H10K 59/80* (2023.01)
  *H10H 20/85* (2025.01)
  *H10K 50/84* (2023.01)

(52) U.S. Cl.
  CPC ............. *H05K 5/03* (2013.01); *H10K 59/871* (2023.02); *H10H 20/8506* (2025.01); *H10K 50/841* (2023.02)

(56) References Cited

U.S. PATENT DOCUMENTS

| | | | | |
|---|---|---|---|---|
| 5,245,213 | A * | 9/1993 | Huang | H01L 21/31056 257/644 |
| 6,407,360 | B1 * | 6/2002 | Choo | B28D 5/00 219/121.68 |
| 9,711,754 | B2 * | 7/2017 | Lee | G02F 1/133351 |
| 10,680,198 | B2 * | 6/2020 | Eo | H10K 59/8722 |
| 2002/0102766 | A1 * | 8/2002 | Shibata | H01L 31/1804 257/E21.216 |
| 2004/0101819 | A1 * | 5/2004 | Montemagno | C12N 5/0658 435/325 |
| 2004/0207033 | A1 * | 10/2004 | Koshido | H03H 9/1092 257/415 |
| 2004/0231246 | A1 * | 11/2004 | Ferranti | C03C 19/00 51/309 |
| 2005/0058423 | A1 * | 3/2005 | Brinkmann | C03C 15/00 385/141 |
| 2005/0182525 | A1 * | 8/2005 | Laverdiere | G05D 7/0635 700/282 |
| 2007/0029911 | A1 * | 2/2007 | Hudspeth | H01J 9/025 313/309 |
| 2009/0197295 | A1 * | 8/2009 | Fournier | H01J 49/0004 250/281 |
| 2010/0126367 | A1 * | 5/2010 | Kim | C03C 17/23 430/323 |
| 2011/0267697 | A1 * | 11/2011 | Kohli | C03C 15/00 428/141 |
| 2012/0034435 | A1 * | 2/2012 | Borrelli | A01N 59/16 428/210 |
| 2012/0040146 | A1 * | 2/2012 | Garner | C03C 17/28 65/53 |
| 2012/0128938 | A1 * | 5/2012 | Rudigier-Voigt | G03F 7/004 156/345.19 |
| 2012/0135195 | A1 * | 5/2012 | Glaesemann | B23K 26/0624 428/156 |
| 2012/0218640 | A1 * | 8/2012 | Gollier | C03C 15/00 359/601 |
| 2013/0005222 | A1 * | 1/2013 | Brown | B24B 9/102 451/44 |
| 2013/0333298 | A1 * | 12/2013 | Kishii | C09K 3/1418 51/308 |
| 2014/0027951 | A1 * | 1/2014 | Srinivas | B23K 26/009 264/400 |
| 2014/0103480 | A1 * | 4/2014 | Lin | H01L 31/18 257/466 |
| 2014/0106172 | A1 * | 4/2014 | Dejneka | C03C 3/093 501/67 |
| 2014/0365688 | A1 * | 12/2014 | Lee | H10N 70/882 257/421 |
| 2015/0017389 | A1 * | 1/2015 | Chai | G03F 7/16 428/156 |
| 2015/0191391 | A1 * | 7/2015 | Sinapi | C03C 15/00 216/48 |
| 2015/0241689 | A1 * | 8/2015 | Sakai | G02B 26/04 359/290 |
| 2015/0290760 | A1 * | 10/2015 | Serikawa | B24B 7/22 252/79.1 |
| 2015/0293271 | A1 * | 10/2015 | Miyasaka | G02B 5/0268 353/38 |
| 2015/0306731 | A1 * | 10/2015 | Qian | B24B 37/24 438/692 |
| 2015/0357387 | A1 | 12/2015 | Lee et al. | |
| 2016/0137548 | A1 * | 5/2016 | Cabral, Jr. | C03C 17/06 65/36 |
| 2016/0326050 | A1 * | 11/2016 | Lee | C03C 21/002 |
| 2016/0329073 | A1 * | 11/2016 | Maeda | G11B 5/73921 |
| 2017/0087687 | A1 * | 3/2017 | Kamireddi | B24B 37/042 |
| 2017/0087793 | A1 * | 3/2017 | Mark | B32B 29/08 |
| 2017/0145259 | A1 * | 5/2017 | Choo | H10D 30/0321 |
| 2017/0354999 | A1 * | 12/2017 | Seo | C23C 16/0245 |
| 2018/0009697 | A1 * | 1/2018 | He | C03B 23/0307 |
| 2018/0033979 | A1 * | 2/2018 | Jang | H10K 50/844 |
| 2018/0037494 | A1 * | 2/2018 | Haghighi | C03C 15/00 |
| 2018/0059454 | A1 * | 3/2018 | Shin | G09F 9/302 |
| 2018/0068975 | A1 * | 3/2018 | Rupp | H01L 21/4803 |
| 2018/0113490 | A1 * | 4/2018 | Chang | C03C 17/28 |
| 2018/0194678 | A1 * | 7/2018 | Scheyvaerts | C03C 21/002 |
| 2018/0217639 | A1 * | 8/2018 | Jones | G06F 1/1652 |
| 2018/0364759 | A1 * | 12/2018 | Ahn | B32B 7/12 |
| 2019/0006449 | A1 * | 1/2019 | Wu | H10K 59/877 |
| 2019/0011605 | A1 * | 1/2019 | Park | C03C 15/00 |
| 2019/0023611 | A1 * | 1/2019 | Luzzato | C03C 21/002 |
| 2019/0050027 | A1 * | 2/2019 | Chang | B32B 17/10137 |
| 2019/0292406 | A1 * | 9/2019 | Cho | C09G 1/04 |
| 2019/0300445 | A1 | 10/2019 | Noguchi et al. | |
| 2019/0337112 | A1 * | 11/2019 | Chu | B24B 9/10 |
| 2020/0168849 | A1 * | 5/2020 | Jung | H10K 71/00 |
| 2020/0292731 | A1 * | 9/2020 | Park | G09F 9/301 |
| 2020/0324521 | A1 | 10/2020 | Park et al. | |
| 2020/0329575 | A1 * | 10/2020 | Park | G06F 1/1652 |
| 2020/0392038 | A1 * | 12/2020 | Park | C03C 15/00 |
| 2021/0078899 | A1 * | 3/2021 | Da | C03C 3/078 |
| 2021/0107826 | A1 * | 4/2021 | Hwang | C03C 17/28 |
| 2021/0135158 | A1 * | 5/2021 | Min | H10K 50/844 |
| 2021/0191467 | A1 * | 6/2021 | Sunwoo | G06F 1/1641 |
| 2021/0384456 | A1 * | 12/2021 | Kim | H10K 50/841 |
| 2022/0004230 | A1 * | 1/2022 | Kashima | G06F 1/1652 |
| 2022/0106218 | A1 * | 4/2022 | Cao | C03C 23/007 |
| 2022/0194848 | A1 * | 6/2022 | Park | C03C 21/002 |
| 2022/0291712 | A1 * | 9/2022 | Baby | H04M 1/0214 |
| 2023/0038532 | A1 * | 2/2023 | Lee | G06F 1/1641 |
| 2023/0071528 | A1 * | 3/2023 | Eo | H10K 59/40 |

FOREIGN PATENT DOCUMENTS

| | | | | |
|---|---|---|---|---|
| CN | 110459152 | A * | 11/2019 | G09G 3/006 |
| CN | 112939474 | A * | 6/2021 | C03C 15/00 |
| KR | 1020150140501 | A | 12/2015 | |
| KR | 2017122554 | A * | 11/2017 | G06F 1/1641 |
| KR | 20190113532 | A * | 10/2019 | C03C 15/00 |
| KR | 102068685 | B1 | 1/2020 | |
| KR | 102111138 | B1 * | 5/2020 | C03C 15/00 |
| KR | 102150391 | B1 | 9/2020 | |
| KR | 102150392 | B1 | 9/2020 | |
| KR | 1020210010911 | A | 1/2021 | |
| WO | WO-2019219009 | A1 * | 11/2019 | C03C 15/00 |

OTHER PUBLICATIONS

Ciprian Iliescu a,*, Francis E.H. Tay a,b, Jianmin Miao c, "Strategies in deep wet etching of Pyrex glass" from Science Direct Sensors and Actuators A 133 (2007) 395-400 (Year: 2007).*
Translation CN-112939474-A (Year: 2021).*
Translation of CN-202701950-U (Year: 2013).*
Translation KR 2017122554 (Year: 2017).*

* cited by examiner

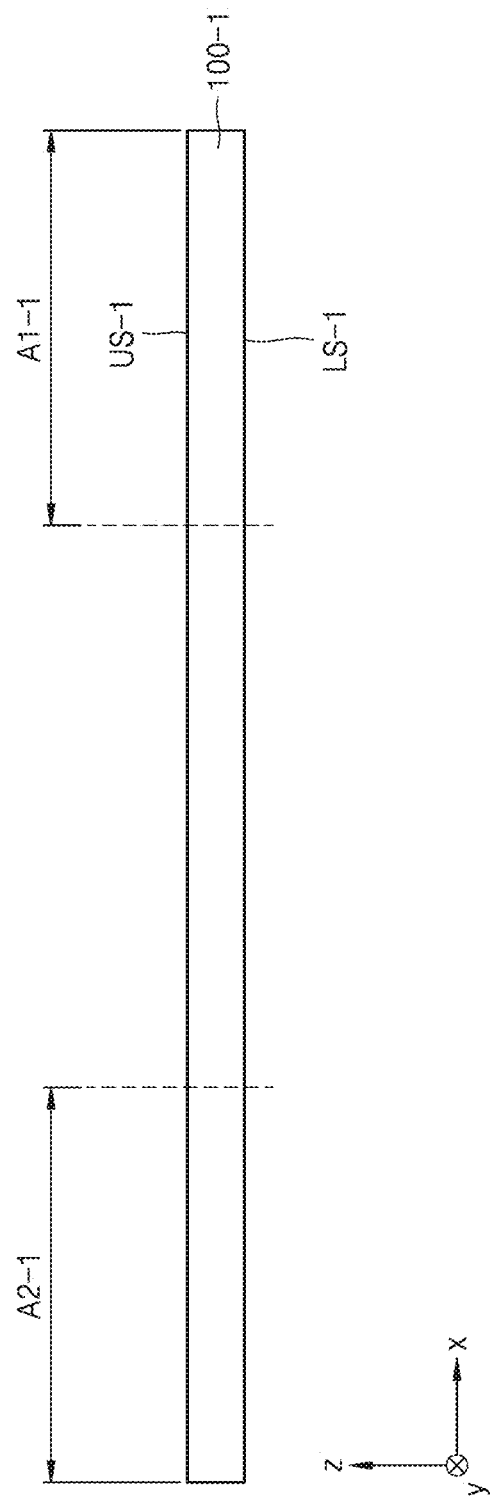

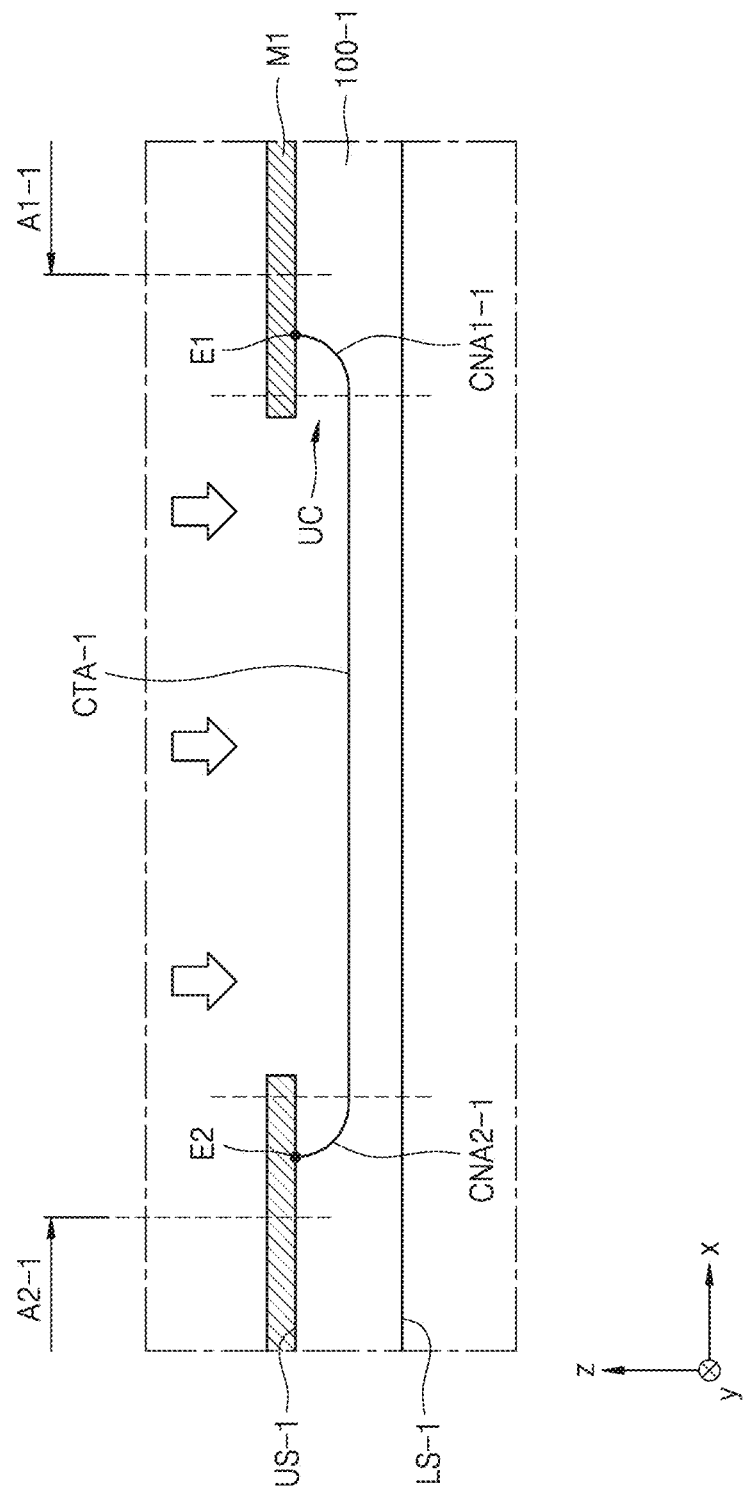

COVER WINDOW, METHOD OF MANUFACTURING THE COVER WINDOW, AND DISPLAY DEVICE

This application claims priority to Korean Patent Application No. 10-2021-0025120, filed on Feb. 24, 2021, and all the benefits accruing therefrom under 35 U.S.C. § 119, the content of which in its entirety is herein incorporated by reference.

BACKGROUND

1. Field

One or more embodiments relate to a cover window, a method of manufacturing the cover window, and a display device.

2. Description of the Related Art

An electronic device based on mobility is widely used. In addition to small electronic devices such as mobile phones, tablet PCs have become recently widely used as mobile electronic devices.

Such mobile electronic device includes a display device having various functions, for example, providing visual information, such as images or videos, to a user. The display device may include a display panel that displays an image and a cover window that protects the display panel. The display device that is bent or folded has been developed. However, research is being conducted so that the cover window can be easily folded while sufficiently protecting the display panel.

If the thickness of the folded area of the cover window is made thin and the remaining area is made thick, the cover window can be easily folded while sufficiently protecting the display panel. However, in this case, a difference in thickness of the cover window having a different thickness for each region may be visually recognized.

SUMMARY

One or more embodiments provide a cover window in which a phenomenon in which a difference in thickness is visually recognized in a cover window having a different thickness for each region is effectively reduced or prevented, a method of manufacturing a cover window, and a display device.

Additional aspects will be set forth in part in the description which follows and, in part, will be apparent from the description, or may be learned by practice of the presented embodiments of the disclosure.

According to one or more embodiments, a cover window includes a lower surface and an upper surface opposite to the lower surface. The upper surface includes: a center area extending in a first direction and being spaced apart from the lower surface by a first interval in a thickness direction, a first curved area extending in a curved shape from a first side of the center area, and a first area extending from the first curved area in the first direction and being spaced apart from the lower surface by a second interval in the thickness direction, and the first curved area includes a first partial area concavely extending from the center area and a second partial area convexly extending from the first partial area in a cross-sectional view.

A virtual first tangential line of the first curved area may extend in the first direction at a first point where the center area and the first curved area meet each other.

A virtual second tangential line of the first curved area may extend in the first direction at a second point where the first area and the first curved area meet each other.

A ratio (Y/X) of a distance (Y) between the first point and the second point in the thickness direction to a distance (X) between the first point and the second point in the first direction may be 0.0017 to 0.0087, and the thickness direction is perpendicular to the first direction.

A virtual tangential line of the first partial area and a virtual tangential line of the second partial area may coincide with each other at a midpoint where the first partial area and the second partial area meet each other.

The upper surface further may include a second curved area extending in a curved shape from a second side of the center area and a second area extending from the second curved area in the first direction, the second side of the center area is opposite the first side thereof, and the second curved area and the second area may be symmetrical to the first curved area and the first area, respectively, with respect to the center area.

A length of the center area in the first direction may be 3 millimeters (mm) to 20 mm.

The second interval may be greater than the first interval.

The cover window may be glass.

According to one or more embodiments, a cover window includes: a display panel; and a cover window arranged on the display panel and including a lower surface and an upper surface opposite to the lower surface. The upper surface includes a center area extending in a first direction and being spaced apart from the lower surface by a first interval in a thickness direction, a first curved area extending in a curved shape from a first side of the center area, a first curved area extending in a curved shape from the first side of the center area, a first area extending from the first curved area in the first direction and being spaced apart from the lower surface by a second interval in the thickness direction, and a second area arranged on a second side of the center area. The second side of the center area is opposite to the first side thereof, the first curved area includes a first partial area concavely extending from the center area and a second partial area convexly extending from the first partial area in a cross-sectional view, and the display device is folded with respect to a folding axis overlapping the center area.

According to one or more embodiments, a method of manufacturing a cover window includes: preparing glass including an upper surface including a first area and a second area spaced apart from each other in a first direction; forming a center area by removing at least part of the glass, where the center area is arranged between the first area and the second area and extends in the first direction; and forming a first curved area extending in a curved shape from a first side of the center area to the first area and a second curved area extending in a curved shape from a second side of the center area to the second area by polishing at least part of the glass The second side of the center area is opposite to the first side thereof, the first curved area includes a first partial area concavely extending from the center area and a second partial area convexly extending from the first partial area in a cross-sectional view.

A virtual first tangential line of the first curved area may extend in the first direction at a first point where the center area and the first curved area meet each other.

A virtual second tangential line of the first curved area may extend in the first direction at a second point where the first area and the first curved area meet each other.

A ratio (Y/X) of a distance (Y) between the first point and the second point in a second direction to a distance (X) between the first point and the second point in the first direction may be 0.0017 to 0.0087, and the second direction is perpendicular to the first direction.

A virtual tangential line of the first partial area may coincide with a virtual tangential line of the second partial area at the midpoint where the first partial area and the second partial area meet each other.

The forming of the first curved area and the second curved area may include polishing edges on the glass, and the edges are a point where the center area and the first area meet each other and a point where the center area and the second area meet each other.

The forming of the center area may include arranging a first mask and a second mask on the first area and the second area, respectively and etching a part of the upper surface exposed between the first mask and the second mask.

The upper surface of the glass may be isotropically etched without agitation.

The forming of the center area may include polishing the upper surface by using a first polishing head, and the forming of the first curved area and the second curved area may include polishing the upper surface by using a second polishing head having a lower hardness than the first polishing head.

The method may further include removing a scratch formed on the upper surface by polishing the upper surface by using a third polishing head having a lower hardness than the second polishing head.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 4A through 4F are cross-sectional views schematically illustrating a method of manufacturing a cover window, according to an embodiment;

DETAILED DESCRIPTION

Figure 1:
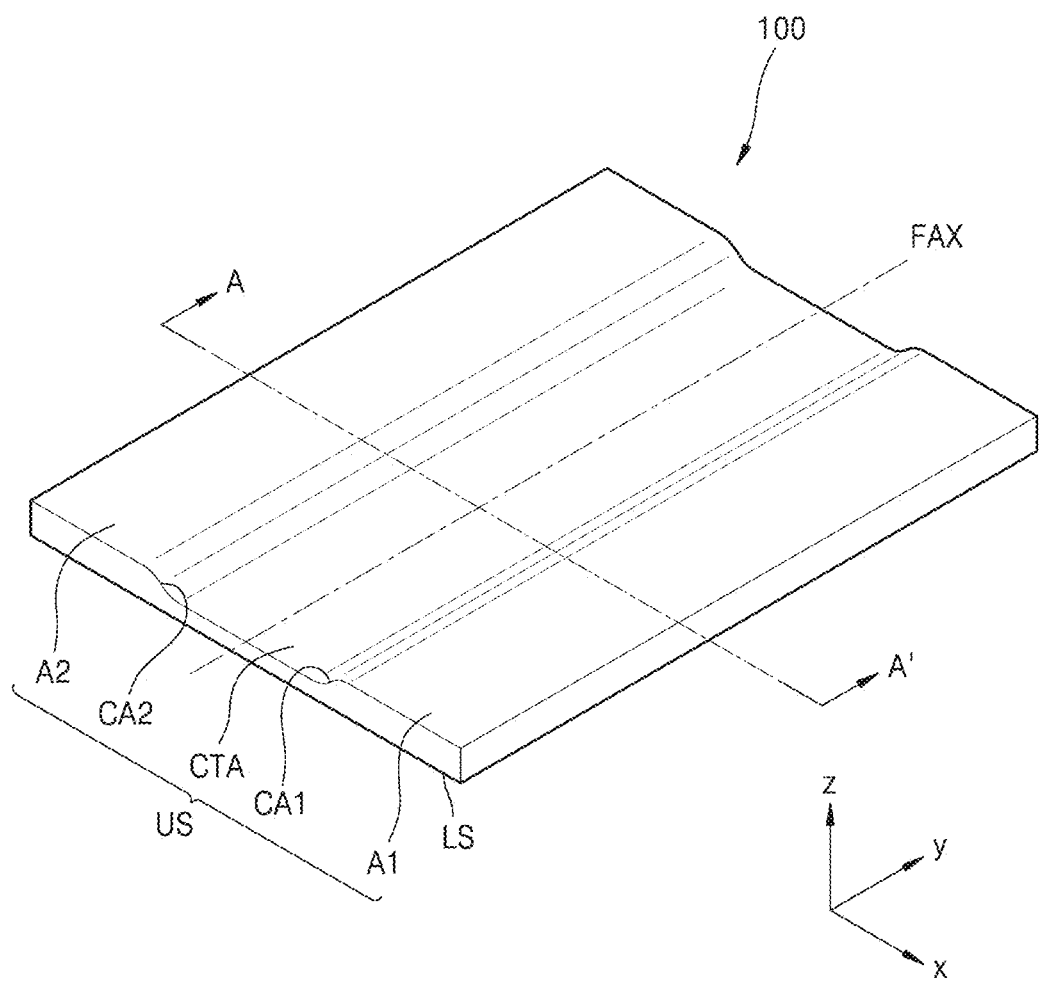
FIG. 1 is a perspective view schematically illustrating a cover window according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described below in more detail with reference to the accompanying drawings. Those components that are the same or are in correspondence are rendered the same reference numeral regardless of the figure number, and a redundant description therewith is omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto When a certain embodiment may be implemented differently, a specific process order may be performed differently from the described order. When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to," another layer, region, or component, it may be directly or indirectly connected to the other layer, region, or component. That is, for example, intervening layers, regions, or components may be present. It will be understood that when a layer, region, or component is referred to as being "electrically connected to," another layer, region, or component, it may be directly or indirectly electrically connected to the other layer, region, or component. That is, for example, intervening layers, regions, or components may be present.

Figure 2:
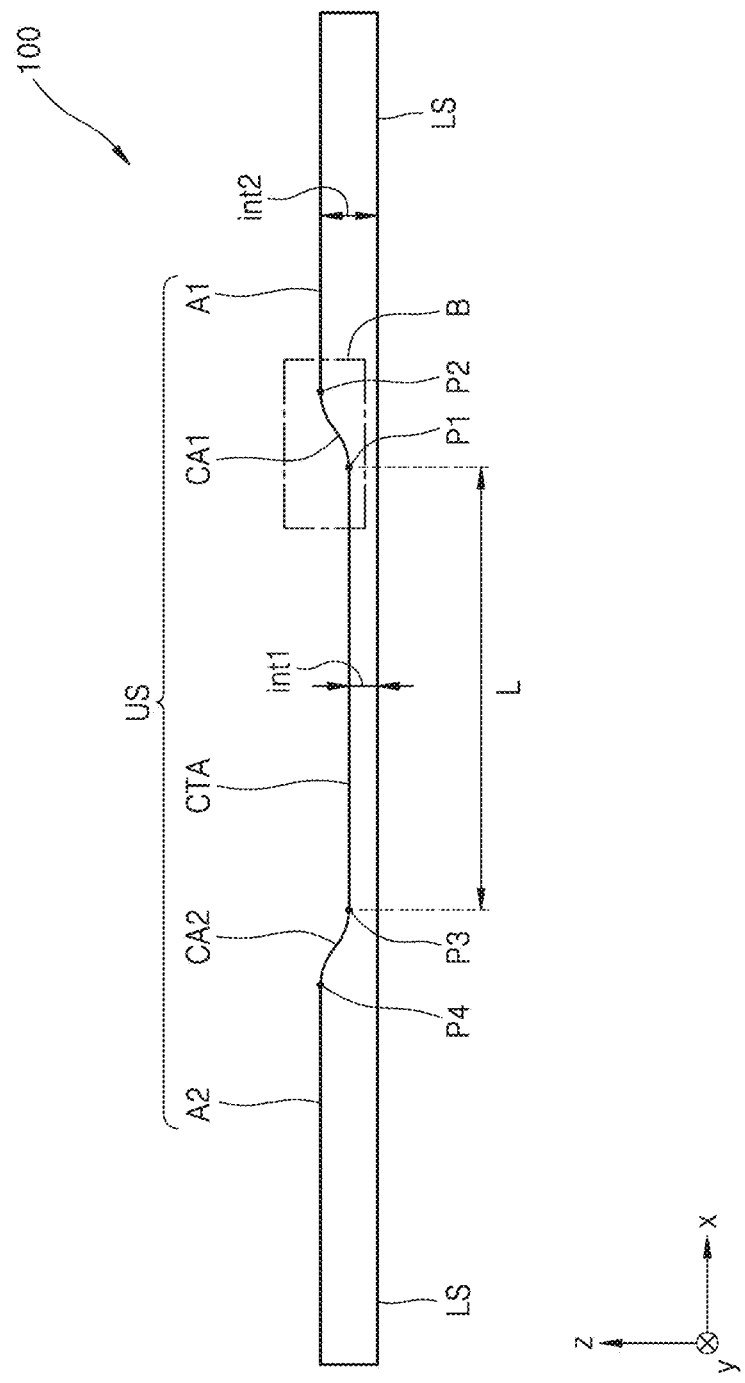
FIG. 2 is a cross-sectional view schematically illustrating the cover window of FIG. 1 taken along line A-A'.
Figure 3:
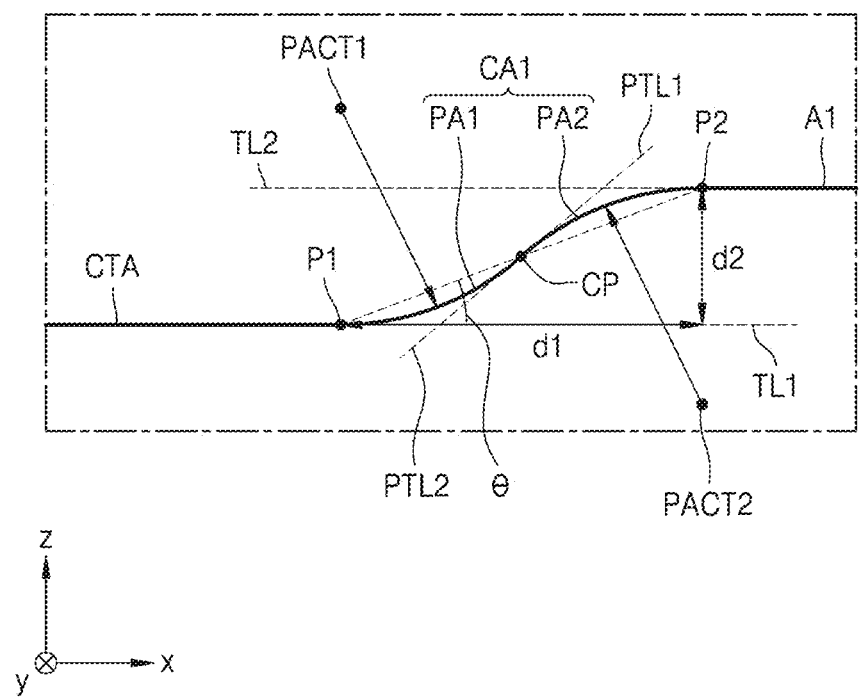
FIG. 3 is an enlarged view of portion B of the cover window of FIG. 2.

FIG. 1 is a perspective view schematically illustrating a cover window 100 according to an embodiment. FIG. 2 is a cross-sectional view schematically illustrating the cover window 100 of FIG. 1 taken along line A-A'. FIG. 3 is an enlarged view of portion B of the cover window 100 of FIG. 2.

Referring to FIGS. 1 through 3, the cover window 100 may be easily bent by an external force without occurrence of cracks. The cover window 100 may include a lower surface LS and an upper surface US. The lower surface LS of the cover window 100 and the upper surface US of the cover window 100 may be opposite surfaces.

In an embodiment, the lower surface LS of the cover window 100 may extend in a first direction and a second direction perpendicular to the first direction. For example, the first direction may be an x direction or −x direction. Here, "x direction" is a direction of an arrow indicating "x" in the figures and "−x direction" is a direction opposite to the x direction. For example, in FIG. 2, x direction is a direction from left to right, and −x direction is a direction from right to left. The same criteria are applied to "y direction" and "z direction". The second direction may be a y direction or −y direction. In other words, the lower surface LS of the cover window 100 may be flat or substantially flat with a plane defined by the first direction and the second direction. In another embodiment, the lower surface LS of the cover window 100 may include a curved surface. In another embodiment, the lower surface LS of the cover window 100 may have a shape symmetrical to the upper surface US of the cover window 100. Hereinafter, a case where the lower surface LS of the cover window 100 extends in the first direction (for example, an x direction or −x direction) and the second direction (for example, a y direction or −y direction), will be described in detail.

The upper surface US of the cover window 100 may include a center area CTA, a first area A1, a first curved area CA1, a second area A2, and a second curved area CA2. The center area CTA may be spaced apart from the lower surface LS of the cover window 100 by a first interval int1. In an embodiment, the center area CTA may be spaced apart from the lower surface LS of the cover window 100 by the first interval int1 in a third direction. The third direction may be a direction perpendicular to each of the first direction (for example, an x direction or −x direction) and the second direction (a y direction or −y direction). For example, the third direction may be a z direction or −z direction, and a thickness direction of the cover window 100.

The center area CTA may extend in the first direction (for example, an x direction or −x direction). In an embodiment, the center area CTA may extend in the first direction (for example, an x direction or −x direction) and the second direction (for example, a y direction or −y direction). The center area CTA may be flat or substantially flat.

The center area CTA may overlap a folding axis FAX in a plan view. As used herein, the "plan view" means a view in the third direction (e.g., z direction or −z direction). The cover window 100 may be folded around the folding axis FAX. The center area CTA may be an area that bends when the cover window 100 is folded. The center area CTA may extend in the first direction (for example, an x direction or −x direction) and the second direction (for example, a y direction or −y direction) and thus may be flat, and the flat center area CTA may reduce a bending repulsive force and/or stress generated when the cover window 100 is folded.

The first curved area CA1 may extend in a curved shape from one side of the center area CTA. In an embodiment, the first curved area CA1 may extend in the first direction (for example, an x direction or −x direction) and the third direction (for example, a z direction or −z direction). In an embodiment, the first curved area CA1 may be concave in the cross-sectional view. The meaning that the first curved area CA1 is concave is that the center of curvature of the first curved area CA1 is over the upper surface US of the cover window 100. That is, the center of curvature of the first curved area CA1 may be distant from the upper surface US of the cover window 100 in a z direction. In another embodiment, the first curved area CA1 may be convex in the cross-sectional view. The meaning that the first curved area CA1 is convex is that the center of curvature of the first curved area CA1 is below the upper surface US of the cover window 100. That is, the center of curvature of the first curved area CA1 may be distant from the upper surface US of the cover window 100 in the −z direction. In another embodiment, the first curved area CA1 may be concave and convex.

The first curved area CA1 and the center area CTA may meet at a first point P1. The first curved area CA1 may extend in a curved shape from the first point P1. The first curved area CA1 may have a virtual first tangential line TL1 at the first point P1. The virtual first tangential line TL1 may extend in the first direction (for example, an x direction or −x direction). That is, the virtual first tangential line TL1 of the first curved area CA1 may extend in the first direction (for example, an x direction or −x direction) at the first point P1 at which the center area CTA and the first curved area CA1 meet each other. Thus, the first point P1 may not be a point at which an inclination of the upper surface US of the cover window 100 is substantially discontinuously changed. Unlike the embodiment, in a case that the inclination of the upper surface US of the cover window 100 is discontinuously changed at the first point P1, in a plan view, a boundary between the center area CTA and the first curved area CA1 may be visually recognized. In contrast, in an embodiment according to the invention, the inclination of the upper surface US of the cover window 100 may be continuously changed at the first point P1, and the boundary between the center area CTA and the first curved area CA1 may not be visually recognized.

In an embodiment, the first curved area CA1 may include a first partial area PA1 and a second partial area PA2. The first partial area PA1 may extend from the center area CTA. In an embodiment, the first partial area PA1 may extend concavely in the cross-sectional view. For example, a curvature center PACT1 of the first partial area PA1 may be located over the upper surface US of the cover window 100.

In an embodiment, the second partial area PA2 may extend from the first partial area PA1. The second partial area PA2 and the first partial area PA1 may meet each other at a midpoint CP. The second partial area PA2 may extend from the midpoint CP. In an embodiment, the second partial area PA2 may extend convexly in the cross-sectional view. For example, a curvature center PACT2 of the second partial area PA2 may be located below the upper surface US of the cover window 100. In an embodiment, the second partial area PA2 may meet the first area A1. For example, one side of the second partial area PA2 may meet the first partial area PA1 at the midpoint CP, and the other side of the second partial area PA2 may meet the first partial area A1 at the second point P2. Thus, the first curved area CA1 may smoothly extend from the center area CTA to the first area A1. In this case, a phenomenon that the boundary between the center area CTA and the first area A1 is visually recognized may be effectively prevented or reduced. In some embodiments, the first curved area CA1 may further include a third partial area that extends from the second partial area PA2 concavely or convexly in the cross-sectional view.

A virtual tangential line PTL1 of the first partial area PA1 at the midpoint CP and a virtual tangential line PTL2 of the second partial area PA2 at the midpoint CP may coincide with each other. That is, the virtual tangential line PTL1 of the first partial area PA1 at the midpoint CP and the virtual tangential line PTL2 of the second partial area PA2 at the midpoint CP may extend in the same direction. In other words, the inclination of the upper surface US of the cover window 100 may be continuously changed from the first partial area PA1 to the second partial area PA2. Thus, the midpoint CP may not be a point at which the inclination of the upper surface US of the cover window 100 is substantially discontinuously changed. In an embodiment of the invention, the inclination of the upper surface US of the cover window 100 may be continuously changed at the midpoint CP, and a boundary between the first partial area PA1 and the second partial area PA2 may not be visually recognized.

The first area A1 may extend from the first curved area CA1 in the first direction (for example, an x direction or −x direction). In an embodiment, the first area A1 may extend in the first direction (for example, an x direction or −x direction) and the second direction (for example, a y direction or −y direction). The first area A1 may be flat or substantially flat.

The first area A1 may be spaced apart from the lower surface LS of the cover window 100 by a second interval int2. In an embodiment, the first area A1 may be spaced apart from the lower surface LS of the cover window 100 in a third direction (for example, a z direction or −z direction) by the second interval int2. The second interval int2 may be greater than or equal to the first interval int1 in the thickness direction.

The first area A1 may be an area that does not bend when the cover window 100 is folded. The cover window 100 may be arranged on a display panel (not shown). In the present embodiment, the thickness of the cover window 100 in the first area A1 may be greater than the thickness of the cover window 100 in the center area CTA. In this case, when the cover window 100 is folded, damage of the display panel may be effectively prevented or reduced while a bending repulsive force in the center area CTA is minimized.

The first region A1 and the first curved area CA1 may meet each other at the second point P2. The first area A1 may extend from the second point P2 in the first direction (for example, an x direction or −x direction). The first curved area CA1 may have a virtual second tangential line TL2 at the second point P2. The virtual second tangential line TL2 may extend in the first direction (for example, an x direction or −x direction). That is, the at the second point P2 at which the first area A1 and the first curved area CA1 meet each other, the virtual second tangential line TL2 of the first curved area CA1 may extend in the first direction (for example, an x direction or −x direction). Thus, the second point P2 may not be a point at which inclination of the upper surface US of the cover window 100 is substantially discontinuously changed. Unlike the embodiment, when the inclination of the upper surface US of the cover window 100 is substantially discontinuously changed at the second point P2, when the cover window 100 is seen in the third direction (for example, a z direction or −z direction), or on the plane (for example, an xy-plane), a boundary between the first area A1 and the first curved area CA1 may be visually recognized. In the present embodiment, the inclination of the upper surface US of the cover window 100 may be continuously changed, and the boundary between the first area A1 and the first curved area CA1 may not be visually recognized.

In an embodiment, a ratio of a second distance d2 between the first point P1 and the second point P2 in a direction perpendicular to the first direction (for example, an x direction or −x direction) with respect to the first distance d1 between the first point P1 and the second point P2 in the first direction (for example, an x direction or −x direction) may be 0.0017 to 0.0087. When the first distance d1 is X and the second distance d2 is Y, the ratio of the second distance d2 with respect to the first distance d1 may be Y/X. In an embodiment, the second distance d2 may be a distance between the first point P1 and the second point P2 in the third direction (for example, a z direction or −z direction). When the ratio of the second distance d2 with respect to the first distance d1 is less than 0.0017, there may be substantially no difference in the thickness of the cover window 100 in the center area CTA and the thickness of the cover window 100 in the first area A1. When the ratio of the second distance d2 with respect to the first distance d1 is greater than 0.0087, a boundary between the center area CTA and the first area A1 may be visually recognized. That is, when the cover window 100 is seen in the first direction (for example, an x direction or −x direction) or on a cross-section (for example, a yz direction), the boundary between the center area CTA and the first area A1 may be visually recognized. Alternatively, when the cover window 100 is seen in the second direction (for example, a y direction or −y direction), or on a cross-section (for example, an xz-cross-section), the boundary between the center area CTA and the first area A1 may be visually recognized. In the present embodiment, because the ratio of the second distance d2 with respect to the first distance d1 is less than 0.0087, the boundary between the center area CTA and the first area A1 may not be visually recognized.

In other words, an angle θ between the virtual first tangential line TL1 and a virtual straight line connecting the first point P1 and the second point P2 may be 0.1 to 5 degrees. Because the first curved area CA1 has a gentle inclination from the center area A1 to the first area A1, a boundary between the center area CTA and the first area A1 may not be visually recognized.

In an embodiment, when the second distance d2 is less than or equal to 30 micrometers (μm), the first distance d1 may be 3 millimeters (mm) to 13 mm. In an embodiment, when the second distance d2 is greater than 30 μm and less than or equal to 50 μm, the first distance d1 may be 5 mm to 15 mm. In an embodiment, when the second distance d2 is greater than 50 μm, the first distance d1 may satisfy the following equation 1.

$$(d2/1000)/0.00872711(d2/3000)*(1/0.001745)+1/0.017455+1/0.087489 \quad \text{[Equation 1]}$$

(where d1 is a first distance and the unit is mm. d2 is a second distance and the unit is μm.)

Thus, because the first curved area CA1 has a gentle inclination from the center area CTA to the first area A1, the boundary between the center area CTA and the first area A1 may not be visually recognized.

The second area A2 may be arranged on the other side of the center area CTA. In an embodiment, the first area A1 may be arranged on one side of the center area CTA, and the second area A2 may be arranged on the other side of the center area CTA. In other words, the first area A1 and the second area A2 may be arranged with the center area CTA therebetween. The second area A2 may extend in the first direction (for example, an x direction or −x direction). In an embodiment, the second area A2 may extend in the first direction (for example, an x direction or −x direction) and the second direction (for example, a y direction or −y direction). The second area A2 may be flat or substantially flat.

The second curved area CA2 may extend in a curved shape from the other side of the center area CTA to the second area A2. For example, the second curved area CA2 and the center area CTA may meet each other at the third point P3, and the second curved area CA2 may extend in a curved shape from the third point P3. In an embodiment, the second curved area CA2 may extend in the first direction (for example, an x direction or −x direction) and the third direction (for example, a z direction or −z direction). In an embodiment, the second curved area CA2 may be concave. In another embodiment, the second curved area CA2 may be convex. In another embodiment, the second curved area CA2 may be concave and convex in the cross-sectional view. The second curved area CA2 may meet the second area A2 at a fourth point P4.

The second area A2 may extend from the second curved area CA2 in the first direction (for example, an x direction or −x direction). In an embodiment, the second area A2 may extend from the fourth point P4 in the first direction (for example, an x direction or −x direction).

In an embodiment, the second curved area CA2 and the second area A2 may be symmetrical to the first curved area CA1 and the first area A1, respectively, based on the center area CTA. For example, the first curved area CA1 and the second curved area CA2 may be symmetrical to each other based on the center area CTA and/or a folding axis FAX. The first area A1 and the second area A2 may be symmetrical to each other based on the center area CTA and/or the folding axis FAX.

In an embodiment, a length L of the center area CTA in the first direction (for example, an x direction or −x direction) between the first curved area CA1 and the second curved area CA2 may be 3 mm to 20 mm. The length L of the center area CTA may be a distance between the first point P1 and the third point P3 in the first direction (for example, an x direction or −x direction). When the length L of the center area CTA is less than 3 mm, advantageous folding characteristics may not be secured by a tolerance generated in a process of manufacturing the cover window 100 or a lamination process of attaching the cover window 100 to the display panel. The folding characteristics may be, for example, a low bending repulsive force, and the like.

In an embodiment, the cover window 100 may be glass. For example, the cover window 100 may be an ultra thin glass ("UTG"). The cover window 100 may be glass processed by a physical strengthening method or chemical strengthening method using an ion exchange method. In another embodiment, the cover window 100 may include sapphire or plastic.

FIGS. 4A through 4F are cross-sectional views schematically illustrating a method of manufacturing a cover window according to an embodiment. FIGS. 4C through 4F are enlarged views of portion B of FIG. 4B.

Referring to FIG. 4A, glass 100-1 may be prepared. The glass 100-1 may include a lower surface LS-1 and an upper surface US-1. The lower surface LS-1 of the glass 100-1 and the upper surface US-1 of the glass 100-1 may be opposite surfaces.

In an embodiment, the lower surface LS-1 of the glass 100-1 and the upper surface US-1 of the glass 100-1 may extend in the first direction (for example, an x direction). The lower surface LS-1 of the glass 100-1 and the upper surface US-1 of the glass 100-1 may extend in the first direction (for example, an x direction or −x direction) and the second direction (for example, a y direction or −y direction). In other words, the lower surface LS-1 of the glass 100-1 and the upper surface US-1 of the glass 100-1 may be flat or substantially flat. In another embodiment, at least one of the lower surface LS-1 of the glass 100-1 and the upper surface US-1 of the glass 100-1 may include a curved surface.

The upper surface US-1 of the glass 100-1 may include a first area A1-1 and a second area A2-2, which are spaced apart from each other. In an embodiment, the first area A1-1 and the second area A2-1 may be spaced apart from each other in the first direction (for example, an x direction or −x direction). The first area A1-1 and the second area A2-1 may be symmetrical to each other based on the center of the glass 100-1.

Figure 4B:
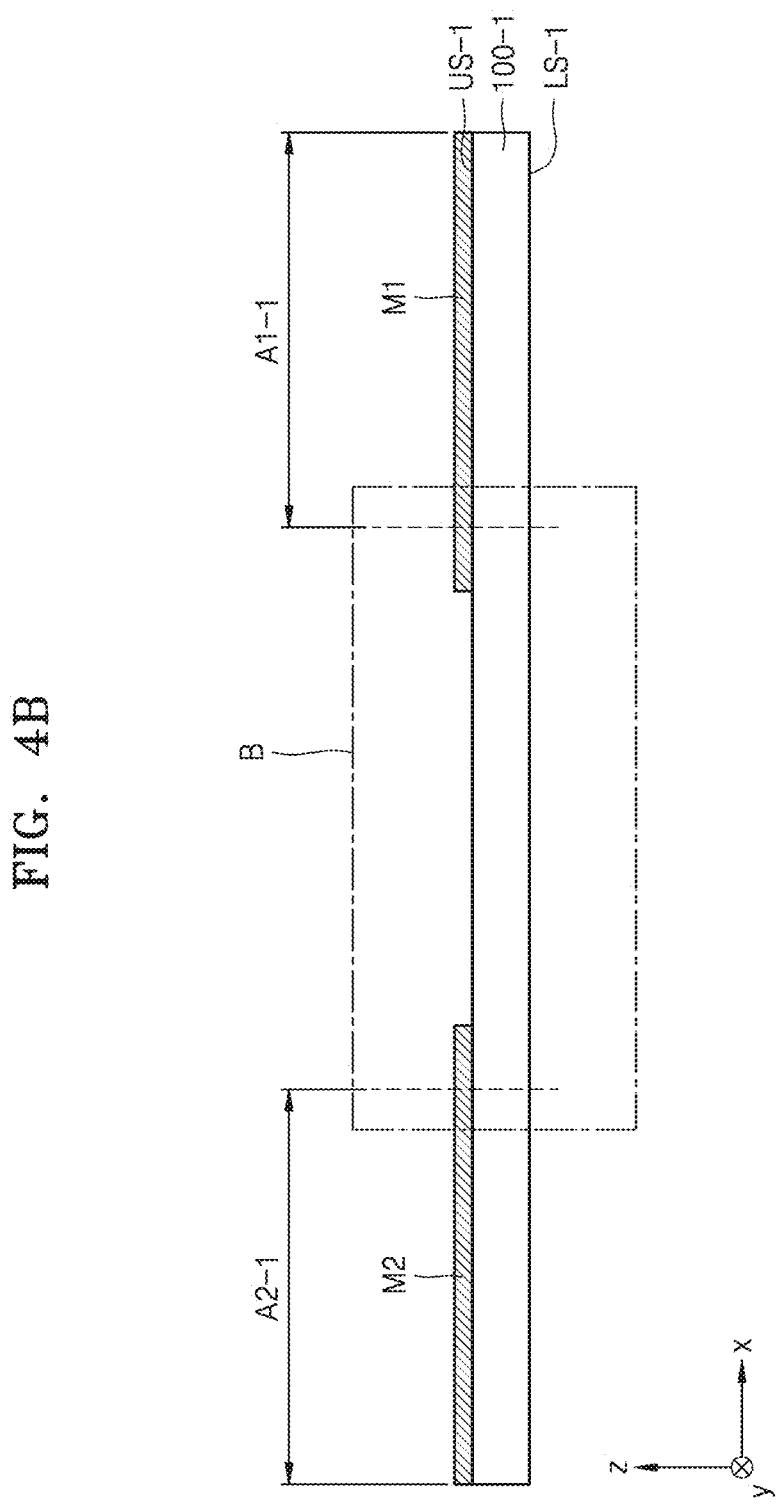
Figure 4D:
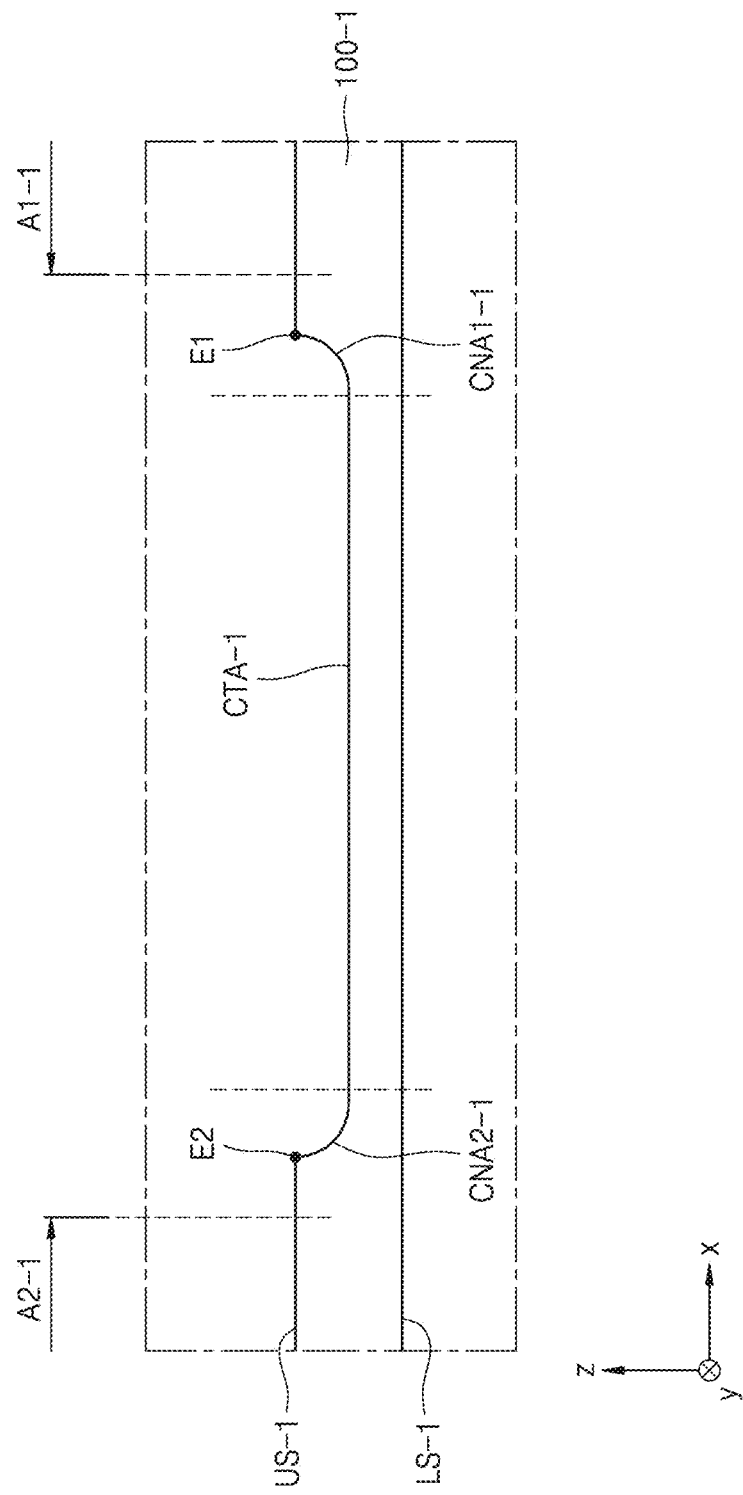

Referring to FIGS. 4B through 4D, at least part of the glass 100-1 may be removed to form a center area CTA-1. The center area CTA-1 may be arranged between the first area A1-1 and the second area A2-1 and may extend in the first direction (for example, an x direction or −x direction). In an embodiment, at least part of the glass 100-1 may be removed by an etching process.

Referring to FIG. 4B, a first mask M1 and a second mask M2 may be arranged on the first area A1-1 and the second area A2-1, respectively. The first mask M1 may overlap the first area A1-1. The second mask M2 may overlap the second area A2-1 in a plan view. The first mask M1 and the second mask M2 may be spaced apart from each other, and part of the upper surface US-1 of the glass 100-1 may be exposed between the first mask M1 and the second mask M2.

At least one of the first mask M1 and the second mask M2 may include an etching resistance material. For example, at least one of the first mask M1 and the second mask M2 may include a PE film.

Referring to FIGS. 4C and 4D, the upper surface US-1 of the glass 100-1 exposed between the first mask M1 and the second mask M2 may be etched. Through etching, the center area CTA-1, a first connection area CNA1-1, and a second connection area CNA2-1 may be formed. The center area CTA-1 may be flat or substantially flat. The flat center area CTA-1 may reduce a bending repulsive force and/or stress generated when the cover window 100 is folded.

The first connection area CNA1-1 may extend from the center area CTA-1 to the first area A1-1. In an embodiment, the first connection area CNA1-1 may extend in a curved shape. For example, the inclination of the etched glass 100-1 may be continuously changed at a point at which the center area CTA-1 and the first connection area CNA-1 meet each other. Thus, the point at which the center area CTA-1 and the first connection area CNA-1 meet each other, may not be visually recognized. In an embodiment, the first connection area CNA1-1 and the first area A1-1 may cross each other. The first connection area CNA1-1 and the first area A1-1, which cross each other, may define a first edge E1. That is, the first edge E1 is a point where the first connection area CNA1-1 and the first area A1-1 meet each other.

In another embodiment, the first connection area CNA1-1 may extend in a linear shape. In this case, the first connection area CNA1-1 and the center area CTA-1 may cross each other. Also, the first connection area CNA1-1 and the first area A1-1 may cross each other.

The second connection area CNA2-1 may extend from the center area CTA-1 to the second area A2-1. In an embodiment, the second connection area CNA2-1 may extend in a curved shape. In an embodiment, the second connection area CNA2-1 and the second area A2-1 may cross each other. The second connection area CNA2-1 and the second area A2-1, which cross each other, may define a second edge E2. That is, the second edge E2 is a point where the first connection area CNA1-1 and the second area A2-1 meet each other. In another embodiment, the second connection area CNA2-1 may extend in a linear shape. The shape of the second connection area CNA2-1 and the shape of the first connection area CNA1-1 may be similar to each other.

In an embodiment, the glass 100-1 may be over-etched. An undercut structure UC may be formed in the glass 100-1. In this case, at least one of a lower surface of the first mask M1 facing the glass 100-1 and a lower surface of the second mask M2 facing the glass 100-1 may be exposed. In another embodiment, the undercut structure UC may not be formed in the glass 100-1.

In an embodiment, the upper surface US-1 of the glass 100-1 may be wet etched. For example, the glass 100-1 may be isotropically etched without agitation. When the glass 100-1 is etched, the curvature of the first connection area CNA1-1 and the curvature of the second connection area CNA2-1 may be controlled by an etch rate and/or etching time. In an embodiment, an etching composition or etchant may include at least one of hydrofluoric acid (HF), ammonium fluoride ($NH_4F$), and nitric acid ($HNO_3$).

When the glass 100-1 is isotropically etched without agitation, the flat center area CTA-1 may be formed. Thus, a high surface quality may be secured in the center area CTA-1. In this case, even if a tolerance occurs in a process of processing the glass 100-1 and/or a lamination process of attaching a cover window made of the glass 100-1 to the display panel, folding characteristics such as a low bending repulsive force and the like may be secured. In another embodiment, the glass 100-1 may be dry etched.

In a process of etching at least part of the glass 100-1, the flat center area CTA-1 may be formed within a relatively short time. Thus, the efficiency of a method of manufacturing a cover window may be enhanced.

Then, the first mask M1 and the second mask M2 may be removed.

Figure 4E:
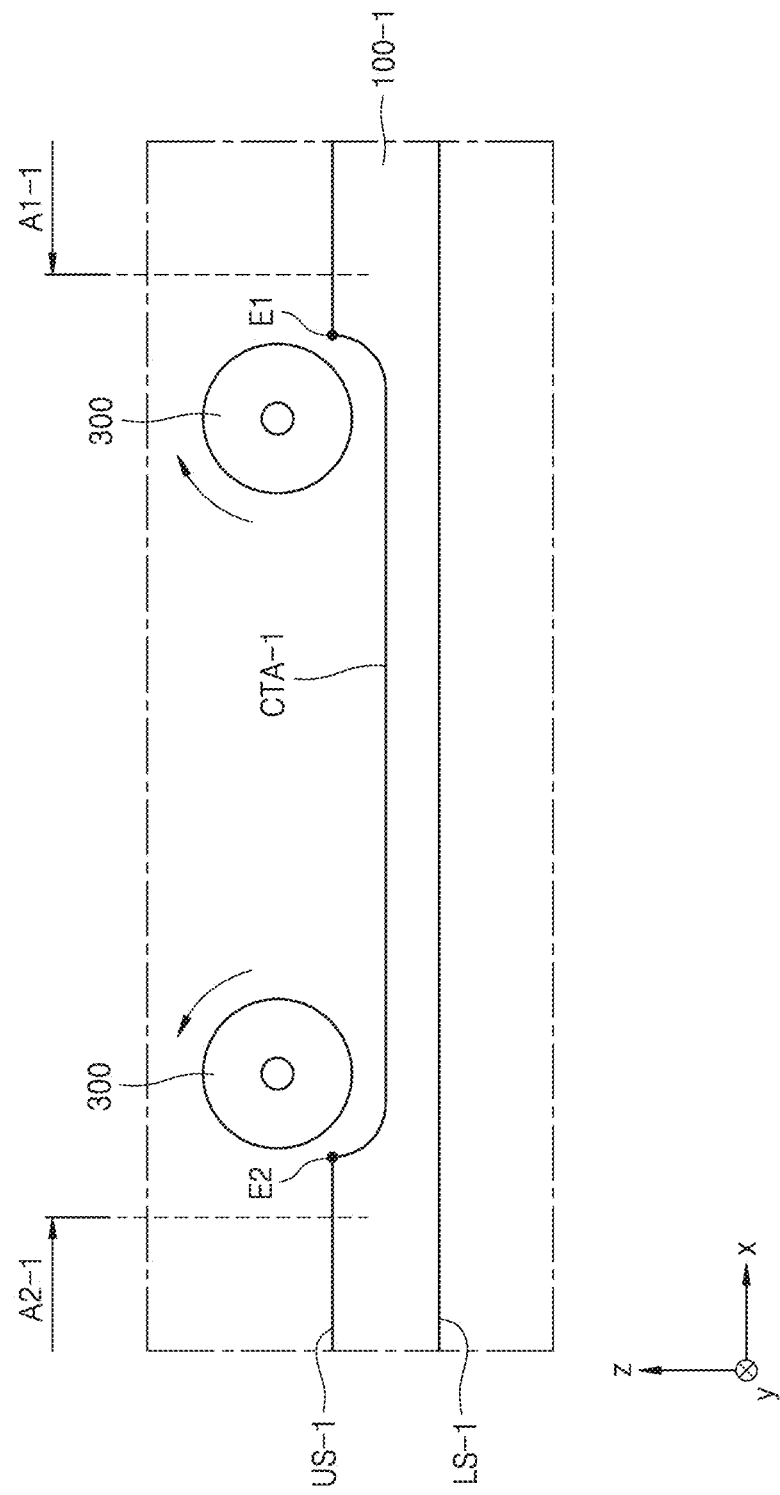
Figure 4F:
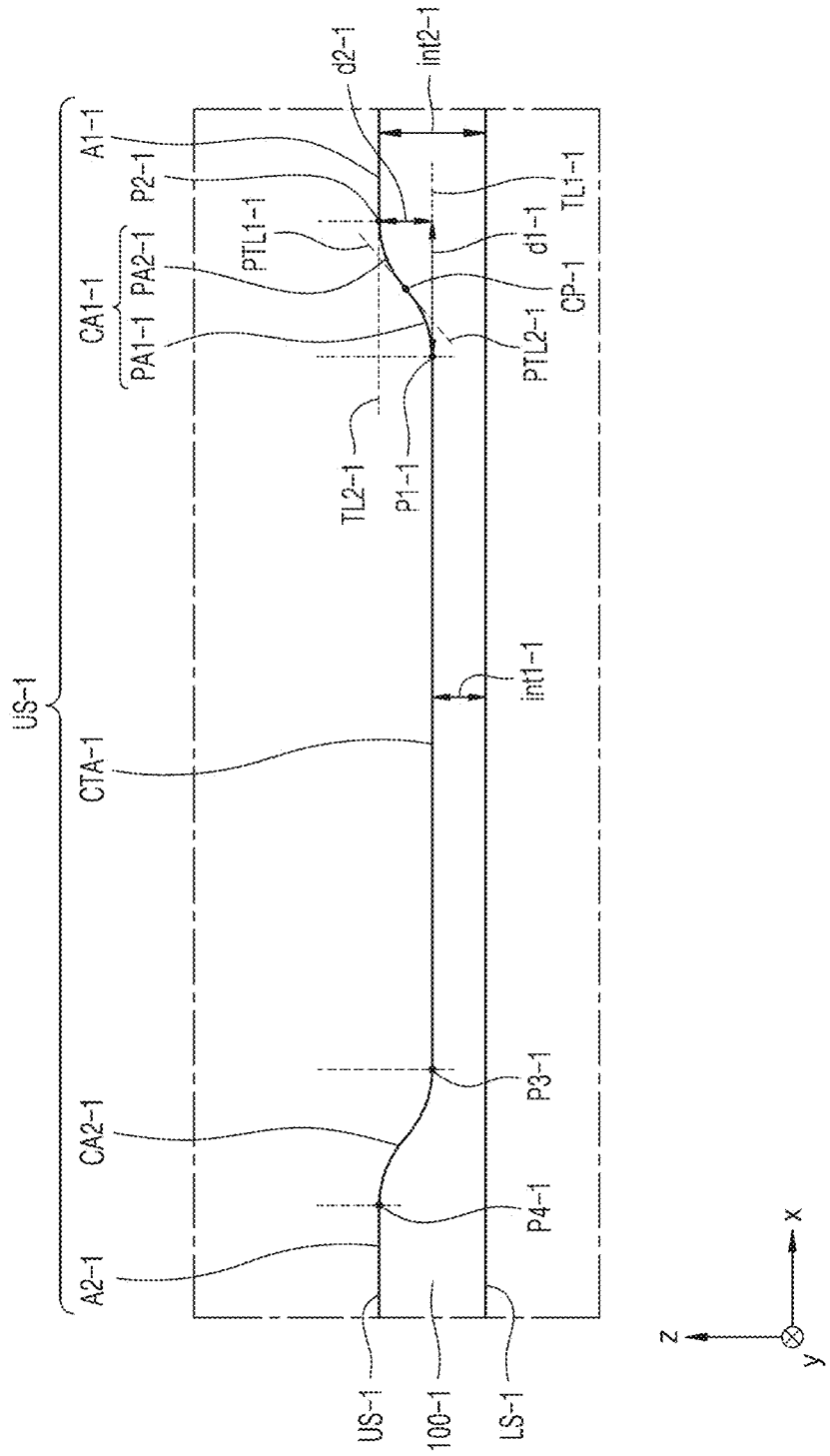

Referring to FIGS. 4E and 4F, a first curved area CA1-1 and a second curved area CA2-1 may be formed by polishing at least part of the glass 100-1. In an embodiment, a polishing head 300 may polish at least part of the glass 100-1. In FIG. 4E, the polishing head 300 is rotated clockwise or counterclockwise based on the second direction (for example, a y direction or −y direction). However, in another embodiment, the polishing head 300 may be rotated clockwise or counterclockwise based on the first direction (for example, an x direction or −x direction) or the third direction (for example, a z direction or −z direction).

In an embodiment, the polishing head 300 may polish edges of the glass 100-1. For example, the polishing head 300 may polish the first edge E1 and/or the second edge E2. Thus, the first edge E1 and/or the second edge E2 may be removed. In FIG. 4E, the first edge E1 and the second edge E2 are polished. However, the polishing head 300 may polish other edges on the upper surface US-1 of the glass 100-1. Thus, the upper surface US-1 of the glass 100-1 may be smooth.

The center area CTA-1 may be spaced apart from the lower surface LS-1 of the glass 100-1 by a first interval int1-1. In an embodiment, the center area CTA-1 may be spaced apart from the lower surface LS-1 of the glass 100-1 in the third direction (for example, a z direction or −z direction) by the first interval int1-1.

The first curved area CA1-1 may extend in a curved shape from one side of the center area CTA-1. In an embodiment, the first curved area CA1-1 may extend in the first direction (for example, an x direction or −x direction) and the third direction (for example, a z direction or −z direction). In an embodiment, the first curved area CA1-1 may be concave in the cross-sectional view. In another embodiment, the first curved area CA1-1 may be convex. In another embodiment, the first curved area CA1-1 may be concave and convex.

The first curved area CA1-1 and the center area CTA-1 may meet each other at the first point P1-1. The first curved area CA1-1 may extend in a curved shape from the first point P1-1. The first curved area CA1-1 may have a virtual first tangential line TL1-1 at the first point P1-1. The virtual first tangential line TL1-1 may extend in the first direction (for example, an x direction or −x direction). That is, at the first point P1-1 at which the center area CTA-1 and the first curved area CA1-1 meet each other, the virtual first tangential line TL1-1 of the first curved area CA1-1 may extend in the first direction (for example, an x direction or −x direction). The inclination of the upper surface US-1 of the glass 100-1 may be continuously changed at the first point P1-1, and a boundary between the center area CTA-1 and the first curved area CA1-1 may not be visually recognized.

In an embodiment, the first curved area CA1-1 may include a first partial area PA1-1 and a second partial area PA2-1. The first partial area PA1-1 may extend from the center area CTA-1. In an embodiment, the first partial area PA1-1 may extend concavely in the cross-sectional view.

In an embodiment, the second partial area PA2-1 may extend from the first partial area PA1-1. The second partial area PA2-1 and the first partial area PA1-1 may meet each other at a midpoint CP-1. The second partial area PA2-1 may extend from the midpoint CP-1. In an embodiment, the second partial area PA2-1 may extend convexly in the cross-sectional view. One side of the second partial area PA2-1 may meet the first partial area PA1-1 at the midpoint CP-1, and the other side of the second partial area PA2-1 may meet the first area A1-1 at the second point P2-1. In some embodiments, the first curved area CA1-1 may further include a third partial area that convexly or concavely extends from the second partial area PA2-1 in the cross-sectional view.

The virtual tangential line PTL1-1 of the first partial area PA1-1 at the midpoint CP-1 and the virtual tangential line PTL2-1 of the second partial area PA2-1 at the midpoint CP-1 may coincide with each other. That is, the virtual tangential line PTL1-1 of the first partial area PA1-1 at the midpoint CP-1 and the virtual tangential line PTL2-1 of the second partial area PA2-1 at the midpoint CP-1 may extend in the same direction. In other words, the inclination of the upper surface US-1 of the glass 100-1 may be continuously changed from the first partial area PA1-1 to the second partial area PA2-1. Thus, the midpoint CP-1 may not be a point at which the inclination of the upper surface US-1 of the glass 100-1 is discontinuously changed. The inclination of the upper surface US-1 of the glass 100-1 may be continuously changed at the midpoint CP-1, and a boundary between the first partial area PA1-1 and the second partial area PA2-1 may not be visually recognized.

The first area A1-1 may be spaced apart from the lower surface LS-1 of the glass 100-1 by the second interval int2-1. In an embodiment, the first area A1-1 may be spaced apart from the lower surface LS-1 of the glass 100-1 in the third direction (for example, a z direction or −z direction) by the second interval int2-1. The second interval int2-1 may be greater than or equal to the first interval int1-1 in the thickness direction.

The first area A1-1 may meet the first curved area CA1-1 at the second point P2-1. The first curved area CA1-1 may have a virtual second tangential line TL2-1 at the second point P2-1. The virtual second tangential line TL2-1 may extend in the first direction (for example, an x direction or −x direction). That is, at the second point P2-1 at which the first area A1-1 and the first curved area CA1-1 meet each other, the virtual second tangential line TL2-1 of the first curved area CA1-1 may extend in the first direction (for example, an x direction or −x direction). The inclination of the upper surface US-1 of the glass 100-1 may be continuously changed at the second point P2-1, and a boundary between the first area A1-1 and the first curved area CA1-1 may not be visually recognized.

In an embodiment, a ratio of a second distance d2-1 between the first point P1-1 and the second point P2-1 in a direction perpendicular to the first direction (for example, an x direction or −x direction) with respect to a first distance d1-1 between the first point P1-1 and the second point P2-1 in the first direction (for example, an x direction or −x direction) may be 0.0017 to 0.0087. When the first distance d1-1 is X and the second distance d2-1 is Y, a ratio of the second distance d2-1 with respect to the first distance d1-1 may be Y/X. In an embodiment, the second distance d2-1 may be a distance between the first point P1-1 and the second point P2-1 in the third direction (for example, a z direction or −z direction). When the ratio of the second distance d2-1 with respect to the first distance d1-1 is less than 0.0017, there may be substantially no difference in the thickness of the glass 100-1 in the center area CTA-1 and the thickness of the glass 100-1 in the first area A1-1. When the ratio of the second distance d2-1 with respect to the first distance d1-1 is greater than 0.0087, a boundary between the center area CTA-1 and the first area A1-1 may be visually recognized. In the present embodiment, because the ratio of the second distance d2-1 with respect to the first distance d1-1 is less than 0.0087, the boundary between the center area CTA-1 and the first area A1-1 may not be visually recognized. The ratio of the second distance d2-1 with respect to the first distance d1-1 may be controlled by polishing the glass 100-1.

The second curved area CA2-1 may extend in a curved shape from the other side of the center area CTA-1 to the second area A2-1. For example, the second curved area CA2-1 and the center area CTA-1 may meet at the third point P3-1, and the second curved area CA2-1 may extend in a curved shape from the third point P3-1. In an embodiment, the second curved area CA2-1 may extend in the first direction (for example, an x direction or −x direction) and the third direction (for example, a z direction or −z direction). In an embodiment, the second curved area CA2-1 may be concave. In another embodiment, the second curved area CA2-1 may be convex. In another embodiment, the second curved area CA2-1 may be concave and convex in the cross-sectional view. The second curved area CA2-1 may meet the second area A2-1 at a fourth point P4-1.

The second area A2-1 may extend from the second curved area CA2-1 in the first direction (for example, an x direction or −x direction). In an embodiment, the second area A2-1 may extend from the fourth point P4-1 in the first direction (for example, an x direction or −x direction).

In an embodiment, the second curved area CA2-1 and the second area A2-1 may be symmetrical to the first curved area CA1-1 and the first area A1-1, respectively, based on the center area CTA-1. For example, the first curved area CA1-1 and the second curved area CA2-1 may be symmetrical to each other based on the center area CTA-1. The first area A1-1 and the second area A2-1 may be symmetrical to each other based on the center area CTA-1.

In some embodiments, additionally, a scratch formed on the upper surface US-1 of the glass 100-1 may be removed by polishing the upper surface US-1 of the glass 100-1.

FIGS. 5A through 5E are perspective views schematically illustrating a method of manufacturing a cover window according to another embodiment. The same reference numerals of FIGS. 5A through 5E as those of FIGS. 4A through 4F refer to the same elements and thus, a redundant description thereof will be omitted.

Figure 5A:
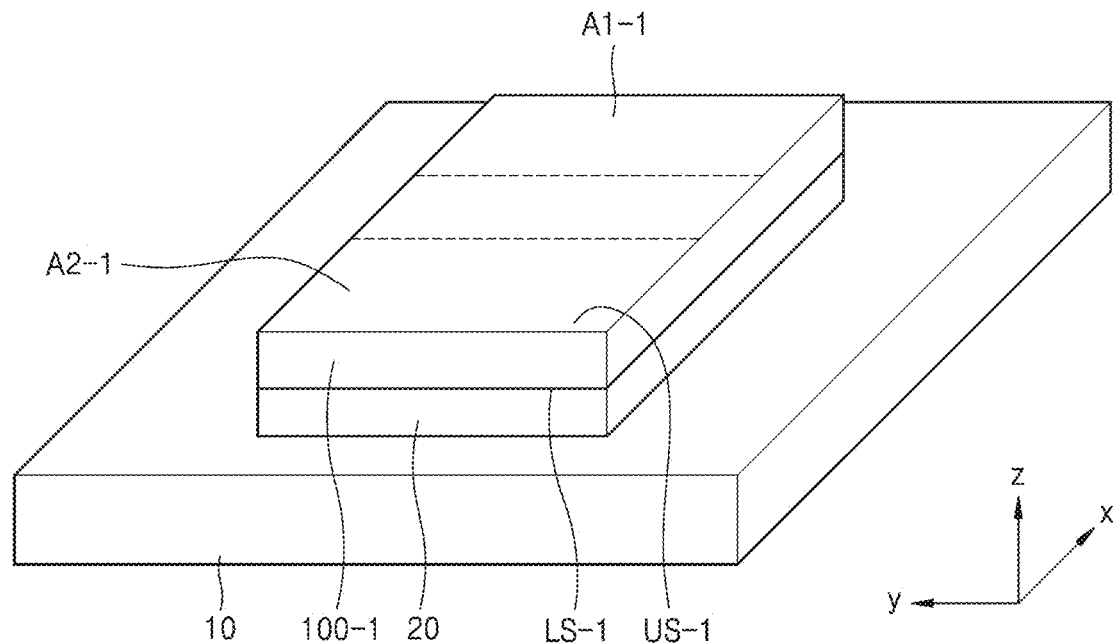
FIGS. 5A through 5E are perspective views schematically illustrating a method of manufacturing a cover window, according to another embodiment.

Referring to FIG. 5A, glass 100-1 may be prepared. The glass 100-1 may include a lower surface LS-1 and an upper surface US-1. The glass 100-1 may be arranged on a jig 10. In an embodiment, a supporter 20 may be arranged between the glass 100-1 and the jig 10. The supporter 20 may face a lower surface LS-1 of the glass 100-1. In an embodiment, the supporter 20 may include a wax, i.e., fatty acid ester. Thus, the supporter 20 may effectively prevent or reduce damage of the glass 100-1.

The upper surface US-1 of the glass 100-1 may include a first area A1-1 and a second area A2-1, which are spaced apart from each other. In an embodiment, the first area A1-1 and the second area A2-1 may be spaced apart from each other in the first direction (for example, an x direction or −x direction).

Figure 5B:
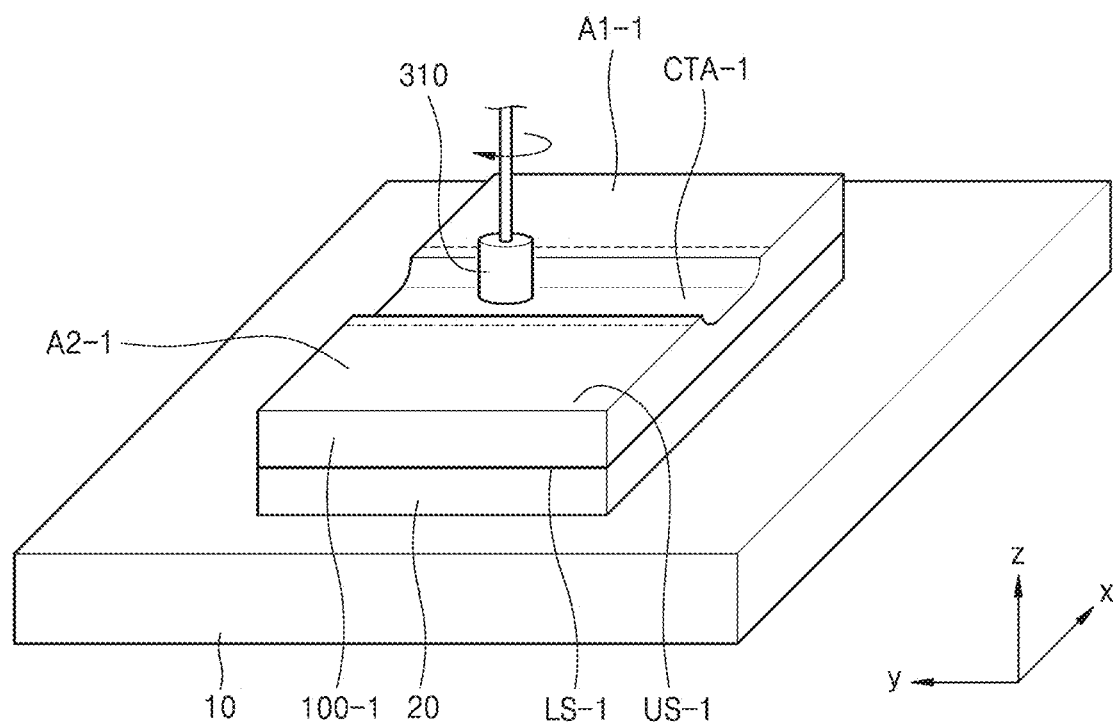

Referring to FIG. 5B, a center area CTA-1 may be formed by removing at least part of the glass 100-1. The center area CTA-1 may be arranged between the first area A1-1 and the second area A2-1. The center area CTA-1 may extend in the first direction (for example, an x direction or −x direction). In an embodiment, the center area CTA-1 may extend in the second direction (for example, a y direction or −y direction) between the first area A1-1 and the second area A2-1. In an embodiment, at least part of the glass 100-1 may be removed by a polishing process. The polishing process may be a mechanical polishing process. In some embodiments, the polishing process may be a chemical mechanical polishing process.

A first polishing head 310 may polish the upper surface US-1 of the glass 100-1. In an embodiment, the first polishing head 310 may be rotated clockwise or counterclockwise based on the third direction (for example, a z direction or −z direction). In another embodiment, the first polishing head 310 may be rotated clockwise or counterclockwise based on the first direction (for example, an x direction or −x direction) or the second direction (for example, a y direction or −y direction). In an embodiment, the first polishing head 310 may be moved in the first direction (for example, an x direction or −x direction), the second direction (for example, a y direction or −y direction), and/or a third direction (for example, a z direction or −z direction).

Figure 5C:
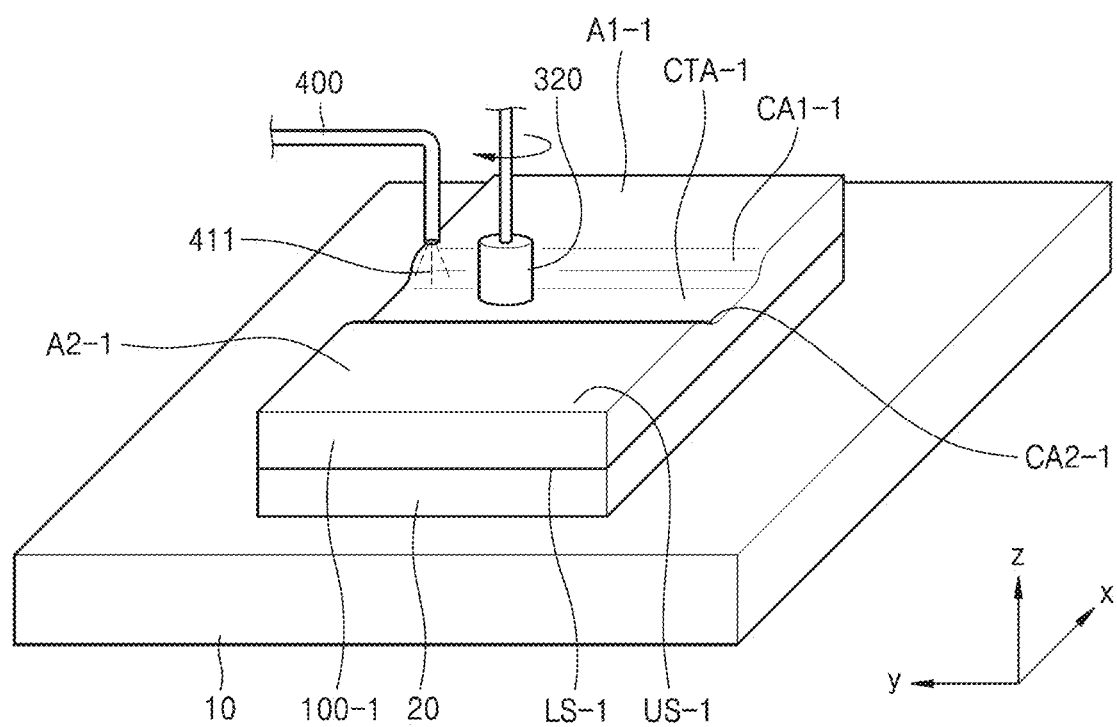

Referring to FIG. 5C, a first curved area CA1-1 and a second curved area CA2-1 may be formed by polishing at least part of the glass 100-1. In an embodiment, a second polishing head 320 may polish the upper surface US-1 of the glass 100-1. The first curved area CA1-1 and the second curved area CA2-1 are similar to the shapes of the first curved area CA1-1 and the second curved area CA2-1 described with reference to FIG. 4F and thus, a detailed description thereof will be omitted.

In an embodiment, the second polishing head 320 may be a polishing head having a lower hardness than the first polishing head (see 310 of FIG. 5B). The second polishing head 320 polishes the upper surface US-1 of the glass 100-1 so that a step height between the center area CTA-1 and the first area A1-1 may be reduced.

In an embodiment, the second polishing head 320 may be rotated clockwise or counterclockwise based on the third direction (for example, a z direction or −z direction). In another embodiment, the second polishing head 320 may be rotated clockwise or counterclockwise based on the first direction (for example, an x direction or −x direction) or the second direction (for example, a y direction or −y direction). In an embodiment, the second polishing head 320 may be moved in the first direction (for example, an x direction or −x direction), the second direction (for example, a y direction or −y direction), and/or the third direction (for example, a z direction or −z direction).

In an embodiment, the second polishing head 320 may polish edges of the glass 100-1. Thus, the upper surface US-1 of the glass 100-1 may be smooth.

A first polishing agent 411 may be supplied to the upper surface US-1 of the glass 100-1. In an embodiment, the first polishing agent 411 may be at least one among deionized water ("DIW"), a surfactant, and a slurry.

The first polishing agent 411 may be supplied to the upper surface US-1 of the glass 100-1 while the second polishing head 320 polishes the glass 100-1 or before polishing is performed. In an embodiment, the glass 100-1 may be chemically and mechanically polished.

In an embodiment, a supply pipe 400 may supply the first polishing agent 411. In another embodiment, the first polishing agent 411 may be supplied through a flow path provided in the second polishing head 320. In another embodiment, a nozzle (not shown) may supply the first polishing agent 411.

In the present embodiment, after the glass 100-1 is polished by the first polishing head 310 to form a center area CTA-1, the glass 100-1 may be polished by the second polishing head 320 to form a first curved area CA1-1 and a second curved area CA2-1. In this case, while maintaining the glass 100-1 arranged on the jig 10, a cover window having a smooth upper surface and a small thickness of the center area CTA-1 may be manufactured. When, while the cover window is manufactured, the glass 100-1 is detached from the jig 10 and another chemical process is performed, damage of the glass 100-1 may occur during transportation of the glass 100-1. In the present embodiment, because the glass 100-1 is mechanically polished and/or chemically and mechanically polished on the same jig 10, the cover window may be manufactured while minimizing transportation of the glass 100-1.

Figure 5D:
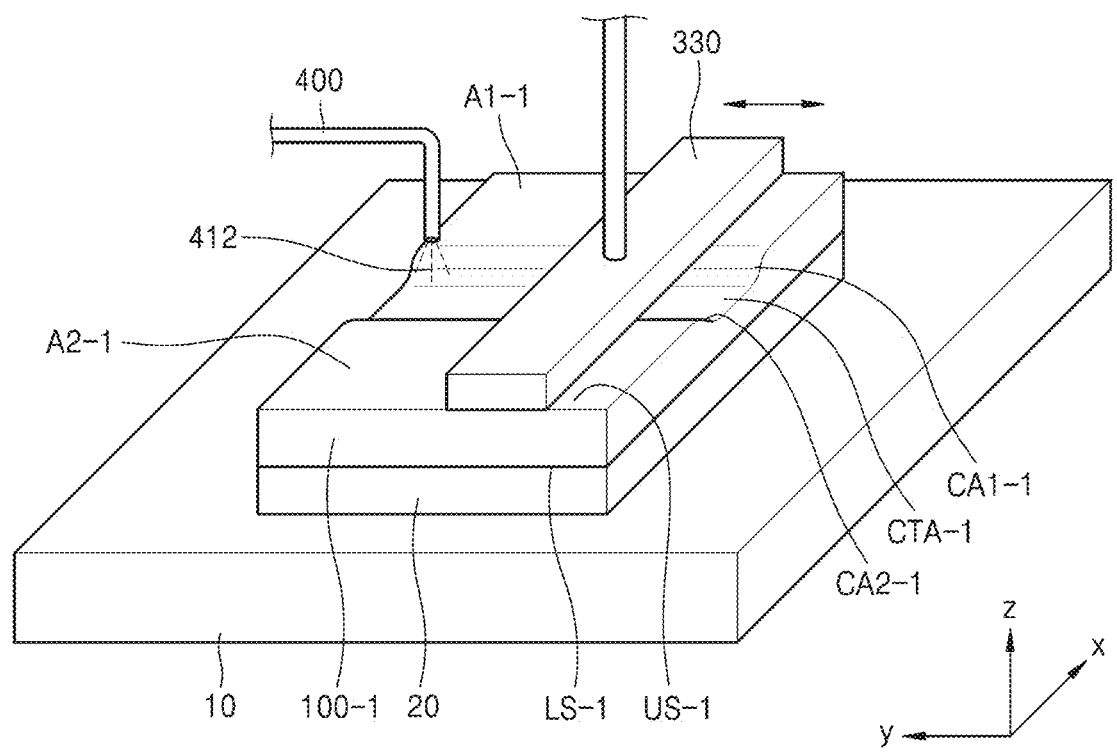
Figure 5E:
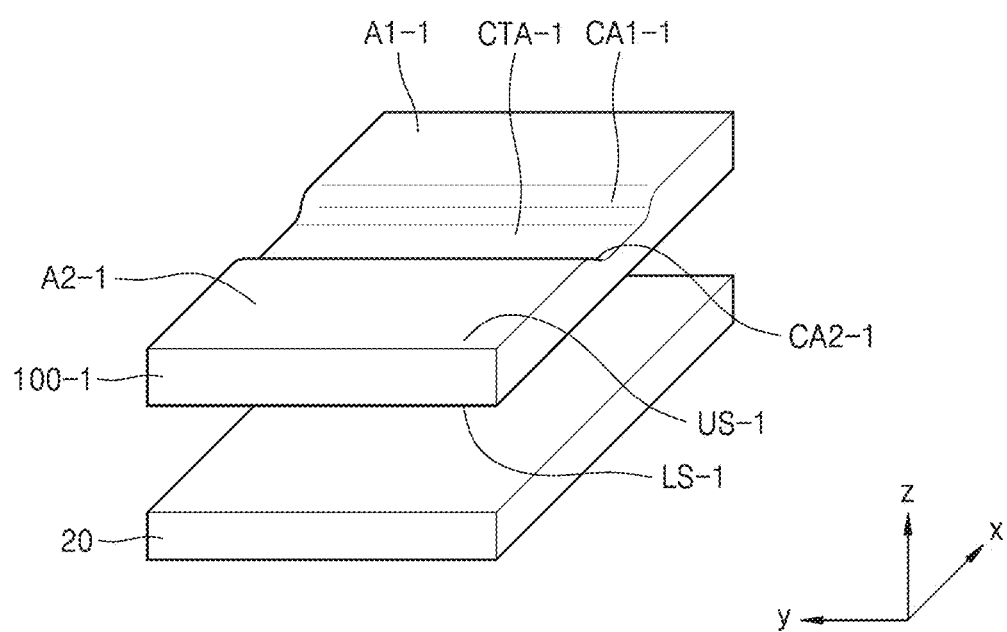

Referring to FIGS. 5D and 5E, a scratch formed on the upper surface US-1 of the glass 100-1 may be removed by polishing the upper surface US-1 of the glass 100-1. In an embodiment, the third polishing head 330 may polish the upper surface US-1 of the glass 100-1. In an embodiment, the third polishing head 330 may include a brush. The brush may be in contact with the upper surface US-1 of the glass 100-1.

The second polishing agent 412 may be supplied to the upper surface US-1 of the glass 100-1. In an embodiment, the second polishing agent 412 may be at least one of DIW, a surfactant, and a slurry. In an embodiment, the second polishing agent 412 may have a smaller particle size than that of the first polishing agent (see 411 of FIG. 5C)

The second polishing agent 412 may be supplied to the upper surface US-1 of the glass 100-1 while the third polishing head 330 polishes the glass 100-1 or before polishing is performed. In an embodiment, the glass 100-1 may be chemically and mechanically polished.

In an embodiment, the third polishing head 330 may be a polishing head having a lower hardness than that of the second polishing head (see 320 of FIG. 5E). A scratch formed on the upper surface US-1 of the glass 100-1 may be removed by polishing the upper surface US-1 of the glass 100-1 by using the third polishing head 330, and the upper surface US-1 of the glass 100-1 may be smoother.

In an embodiment, the third polishing head 330 may be moved in the first direction (for example, an x direction or −x direction), the second direction (for example, a y direction or −y direction), and/or the third direction (for example, a z direction or −z direction).

Thereafter, the supporter 20 and the jig 10 may be separated from each other, and the supporter 20 and the glass 100-1 may be separated from each other. Thereafter, the glass 100-1 may be cleaned. In this way, a cover window may be manufactured from the glass 100-1.

Figure 6A:
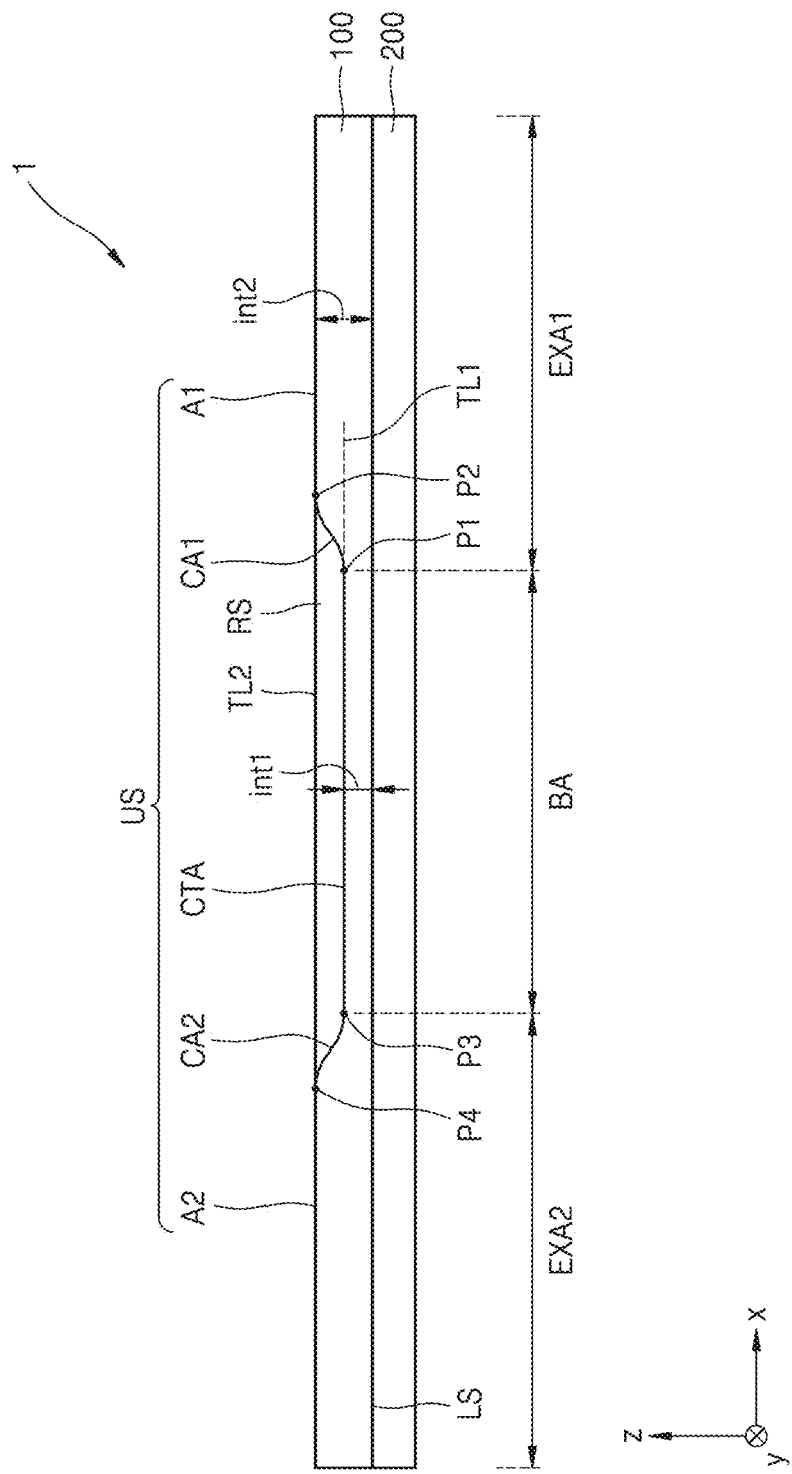
FIGS. 6A and 6B are cross-sectional views schematically illustrating a display device according to an embodiment.
Figure 6B:
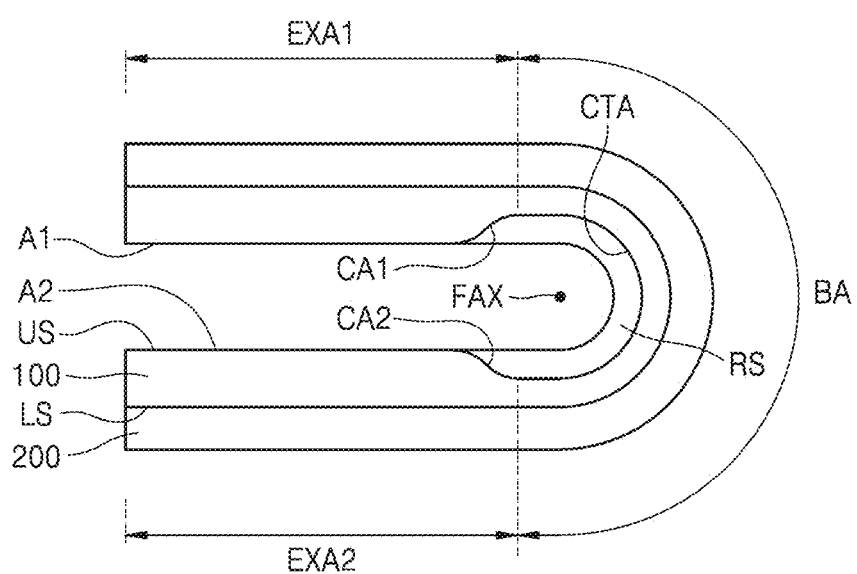

FIGS. 6A and 6B are cross-sectional views schematically illustrating a display device 1 according to an embodiment. FIG. 6A is a cross-sectional view illustrating a state in which the display device 1 is unfolded. FIG. 6B is a cross-sectional view illustrating a state in which the display device 1 is folded. The same reference numerals of FIGS. 6A and 6B as those of FIGS. 1 through 3 refer to the same elements and thus, a redundant description thereof will be omitted.

Referring to FIGS. 6A and 6B, the display device 1 may include a cover window 100, a display panel 200, and a resin material RS. The cover window 100 may be easily bent according to an external force without occurrence of cracks. The cover window 100 may include a lower surface LS and an upper surface US. The lower surface LS of the cover window 100 and an upper surface US of the cover window 100 may be opposite surfaces.

The display panel 200 may display an image. The display panel 200 may include a display element and may display an image using the display element. The display element may be an organic light emitting diode including an organic emission layer. Alternatively, the display element may be a light emitting diode ("LED"). The size of the light emitting diode (LED) may be a micro-scale or nano-scale. For example, the light emitting diode (LED) may be a micro LED. Alternatively, the light emitting diode (LED) may be a nanorod LED. The nanorod LED may include gallium nitride (GaN). In an embodiment, a color conversion layer may be arranged on the nanorod LED. The color conversion layer may include a quantum dot. Alternatively, the display element may be a quantum dot light emitting diode including a quantum dot emission layer. Alternatively, the display element may be an inorganic light emitting diode including an inorganic semiconductor.

The display panel 200 may overlap the cover window 100 in a plan view. The cover window 100 may be arranged on the display panel 200. In an embodiment, the lower surface LS of the cover window 100 may face an upper surface of the display panel 200. In another embodiment, the upper surface US of the cover window 100 may face the upper surface of the display panel 200. In an embodiment, the display panel 200 may emit light in a direction from the upper surface of the display panel 200 toward the cover window 100.

The display panel 200 may include a bending area BA, a first extension area EXA1, and a second extension area EXA2. The bending area BA may be an area in which the display panel 200 is folded. The bending area BA may overlap the center area CTA of the cover window 100. The first extension area EXA1 may be an area that extends from one side of the bending area BA. The first extension area EXA1 may overlap the first area A1 of the cover window 100. The second extension area EXA2 may be an area that extends from the other side of the bending area BA. The second extension area EXA2 may overlap the second area A2 of the cover window 100 in a plan view.

The resin material RS may be arranged on the upper surface US of the cover window 100. In an embodiment, the resin material RS may overlap the center area CTA. The resin material RS may fill a groove defined with the center area CTA, the first curved area CA1 and the second curved area CA2 of the cover window 100. In an embodiment, an upper surface of the resin material RS, a first area A1, and a second area A2 may be entirely flat.

The resin material RS may be optical clear resin ("OCR"). In an embodiment, the resin material RS may include at least one among acryl, epoxy, silicon, urethane, urethane composite, and urethane acrylic composite.

The display device 1 may be folded around a folding axis FAX that overlaps the center area CTA. Referring to FIG. 6A, the display device 1 may include an unfolded state. Referring to FIG. 6A, the display device 1 may include a folded state. In an embodiment, the display device 1 may be folded in an in-folding manner. For example, the display device 1 may be folded in such a way that the first area A1 of the cover window 100 and the second area A2 of the cover window 100 may face each other. In another embodiment, the display device 1 may be folded in an out-folding manner. For example, the display device 1 may be folded in such a way that the first area A1 of the cover window 100 and the second area A2 of the cover window 100 may face opposite directions.

The second interval int2 may be greater than or equal to the first interval int1 in the thickness direction. Thus, the thickness of the cover window 100 in the first area A1 may be greater than the thickness of the cover window 100 in the center area CTA, and when the cover window 100 is folded, a bending repulsive force in the center area CTA may be minimized. Also, the first extension area EXA1 of the display panel 200 and the second extension area EXA2 of the display panel 200 may be protected.

The cover window 100 according to an embodiment may be smooth in a portion where the thickness of the cover window 100 is changed. Thus, a phenomenon that a difference in thickness in the portion where the thickness of the cover window 100 is changed, is visually recognized, may be effectively prevented or reduced. For example, a phenomenon that a boundary between adjacent areas of the upper surface US of the cover window 100 at the first point P1, the second point P2, the third point P3 and the fourth point P4 is visually recognized, may be effectively prevented or reduced.

As described above, a cover window according to an embodiment may be smooth in a portion where the thickness of the cover window is changed. Thus, a phenomenon that a difference in thickness in the portion where the thickness of the cover window is changed, is visually recognized, may be effectively prevented or reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a cover window, the method comprising:
preparing glass on a jig and a supporter between the glass and the jig, wherein the glass includes an upper surface comprising a first area and a second area spaced apart from each other in a first direction, and the supporter faces a lower surface of the glass and includes a wax;
supplying a polishing agent including a surfactant to the upper surface of the glass, wherein the polishing agent includes a first polishing agent and a second polishing agent of which particle size is smaller than a particle size of the first polishing agent;
forming a center area by removing at least part of the glass, the center area being arranged between the first area and the second area and extending in the first direction; and
forming a first curved area extending in a curved shape from a first side of the center area to the first area and a second curved area extending in a curved shape from a second side of the center area to the second area, by polishing at least part of the glass,
wherein the second side of the center area is opposite to the first side thereof, and
the first curved area comprises a first partial area concavely extending from the center area and a second partial area convexly extending from the first partial area in a cross-sectional view,
wherein the forming of the center area comprises polishing the upper surface by using a first polishing head to form the center area, which is flat, and
the forming of the first curved area and the second curved area comprises polishing the upper surface by using a second polishing head having a lower hardness than the first polishing head to form the concavely extended first partial area and the convexly extended second partial area, and
wherein the method further comprises removing a scratch formed on the upper surface by polishing the upper surface by using a third polishing head having a lower hardness than the second polishing head,
wherein the supplying of the polishing agent includes supplying the first polishing agent while the second polishing head is used and supplying the second polishing agent while the third polishing head is used.

2. The method of claim 1, wherein a virtual first tangential line of the first curved area extends in the first direction at a first point where the center area and the first curved area meet each other.

3. The method of claim 2, wherein a virtual second tangential line of the first curved area extends in the first direction at a second point where the first area and the first curved area meet each other.

4. The method of claim 3, wherein a ratio (Y/X) of a distance (Y) between the first point and the second point in a second direction to a distance (X) between the first point and the second point in the first direction is 0.0017 to 0.0087, and the second direction is perpendicular to the first direction.

5. The method of claim 1, wherein a virtual tangential line of the first partial area coincides with a virtual tangential line of the second partial area at the midpoint where the first partial area and the second partial area meet each other.

6. The method of claim 1, wherein the forming of the first curved area and the second curved area comprises polishing edges on the glass, and the edges are a point where the center area and the first area meet each other and a point where the center area and the second area meet each other.

\* \* \* \* \*